United States Patent
Sun et al.

(10) Patent No.: US 12,195,839 B2
(45) Date of Patent: *Jan. 14, 2025

(54) ION BEAM SPUTTERING WITH ION ASSISTED DEPOSITION FOR COATINGS ON CHAMBER COMPONENTS

(71) Applicant: Applied Materials, Inc., Santa Clara, CA (US)

(72) Inventors: Jennifer Y. Sun, Mountain View, CA (US); Vahid Firouzdor, San Mateo, CA (US); Biraja Prasad Kanungo, San Jose, CA (US); Tom K Cho, Los Altos, CA (US); Vedapuram S. Achutharaman, Saratoga, CA (US); Ying Zhang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 58 days.

This patent is subject to a terminal disclaimer.

(21) Appl. No.: 18/101,273

(22) Filed: Jan. 25, 2023

(65) Prior Publication Data

US 2023/0167540 A1 Jun. 1, 2023

Related U.S. Application Data

(60) Division of application No. 15/844,251, filed on Dec. 15, 2017, now Pat. No. 11,566,319, which is a
(Continued)

(51) Int. Cl.
*C23C 14/08* (2006.01)
*C04B 35/00* (2006.01)
(Continued)

(52) U.S. Cl.
CPC ............ *C23C 14/088* (2013.01); *C04B 35/00* (2013.01); *C04B 35/505* (2013.01);
(Continued)

(58) Field of Classification Search
CPC ..... C23C 14/088; C23C 14/08; C23C 14/083; C23C 14/46; H01J 37/32477
See application file for complete search history.

(56) References Cited

U.S. PATENT DOCUMENTS

| | | |
|---|---|---|
| 3,796,182 A | 3/1974 | Rosler |
| 4,399,199 A | 8/1983 | McGill et al. |

(Continued)

FOREIGN PATENT DOCUMENTS

| | | |
|---|---|---|
| CN | 101121308 A | 2/2008 |
| CN | 1690254 B | 3/2013 |

(Continued)

OTHER PUBLICATIONS

Hass et al., "Gas jet assisted vapor deposition of yttria stabilized zirconia," Department of Materials Science and Engineering, School of Engineering and Applied Science, published Feb. 27, 2009 University of Virginia, Charlottesville, Virginia.

(Continued)

*Primary Examiner* — John J Brayton
(74) *Attorney, Agent, or Firm* — LOWENSTEIN SANDLER LLP

(57) ABSTRACT

A method includes performing ion beam sputtering with ion assisted deposition to deposit a protective layer on a surface of a body. The protective layer is a plasma resistant rare earth-containing film of a thickness less than 1000 μm. The porosity of the protective layer is below 1%. The plasma resistant rare earth-containing film consists of 40 mol % to less than 100 mol % of $Y_2O_3$, over 0 mol % to 60 mol % of $ZrO_2$, and 0 mol % to 9 mol % of $Al_2O_3$.

20 Claims, 5 Drawing Sheets

Related U.S. Application Data continuation of application No. 15/711,885, filed on Sep. 21, 2017, now Pat. No. 11,566,317, which is a division of application No. 15/211,993, filed on Jul. 15, 2016, now Pat. No. 9,797,037, which is a continuation of application No. 14/562,339, filed on Dec. 5, 2014, now Pat. No. 9,725,799.

(60) Provisional application No. 61/912,961, filed on Dec. 6, 2013.

(51) Int. Cl.

| | | |
|---|---|---|
| *C04B 35/505* | (2006.01) | |
| *C04B 35/622* | (2006.01) | |
| *C04B 41/00* | (2006.01) | |
| *C04B 41/45* | (2006.01) | |
| *C04B 41/50* | (2006.01) | |
| *C04B 41/52* | (2006.01) | |
| *C04B 41/87* | (2006.01) | |
| *C04B 41/89* | (2006.01) | |
| *C23C 14/46* | (2006.01) | |
| *C23C 14/58* | (2006.01) | |
| *H01J 37/32* | (2006.01) | |

(52) U.S. Cl.
CPC ...... *C04B 35/62222* (2013.01); *C04B 41/009* (2013.01); *C04B 41/4529* (2013.01); *C04B 41/5045* (2013.01); *C04B 41/52* (2013.01); *C04B 41/87* (2013.01); *C04B 41/89* (2013.01); *C23C 14/08* (2013.01); *C23C 14/083* (2013.01); *C23C 14/46* (2013.01); *C23C 14/5806* (2013.01); *H01J 37/32477* (2013.01); *C04B 2235/3217* (2013.01); *C04B 2235/3222* (2013.01); *C04B 2235/3225* (2013.01); *C04B 2235/3246* (2013.01); *C04B 2235/3418* (2013.01); *C04B 2235/3826* (2013.01); *C04B 2235/3873* (2013.01); *C04B 2235/428* (2013.01); *C04B 2235/445* (2013.01); *Y10T 428/26* (2015.01); *Y10T 428/265* (2015.01)

(56) References Cited

U.S. PATENT DOCUMENTS

| | | | |
|---|---|---|---|
| 4,695,439 A | 9/1987 | Ritsko et al. | |
| 4,773,928 A | 9/1988 | Houck et al. | |
| 4,880,614 A | 11/1989 | Strangman et al. | |
| 4,988,670 A | 1/1991 | Itozaki et al. | |
| 5,415,756 A | 5/1995 | Wolfe et al. | |
| 5,573,862 A | 11/1996 | Gualtieri et al. | |
| 5,630,314 A | 5/1997 | Kojima et al. | |
| 5,687,679 A | 11/1997 | Mullin et al. | |
| 5,741,544 A | 4/1998 | Mahulikar | |
| 5,837,058 A | 11/1998 | Chen et al. | |
| 5,840,434 A | 11/1998 | Kojima et al. | |
| 5,961,776 A | 10/1999 | Sato et al. | |
| 6,215,806 B1 | 4/2001 | Ohmi et al. | |
| 6,323,076 B1 | 11/2001 | Wilford | |
| 6,326,076 B1 | 12/2001 | Takai | |
| 6,383,964 B1 | 5/2002 | Nakahara et al. | |
| 6,444,083 B1 | 9/2002 | Steger et al. | |
| 6,530,990 B2 | 3/2003 | Kong et al. | |
| 6,548,424 B2 | 4/2003 | Putkonen | |
| 6,576,354 B2 | 6/2003 | Tsukatani et al. | |
| 6,632,549 B1 | 10/2003 | Ohashi et al. | |
| 6,641,941 B2 | 11/2003 | Yamada et al. | |
| 6,645,585 B2 | 11/2003 | Ozono | |
| 6,733,843 B2 | 5/2004 | Tsukatani et al. | |
| 6,777,353 B2 | 8/2004 | Putkonen | |
| 6,783,875 B2 | 8/2004 | Yamada et al. | |
| 6,794,047 B2 | 9/2004 | Takai et al. | |
| 6,858,332 B2 | 2/2005 | Yamada | |
| 6,858,546 B2 | 2/2005 | Niinisto et al. | |
| 6,884,514 B2 | 4/2005 | Simpson et al. | |
| 6,916,534 B2 | 7/2005 | Waraya et al. | |
| 6,949,203 B2 | 9/2005 | Hsieh et al. | |
| 6,962,524 B2 | 11/2005 | Butterfield et al. | |
| 7,101,819 B2 | 9/2006 | Rosenflanz | |
| 7,138,192 B2 | 11/2006 | Yamada et al. | |
| 7,226,673 B2 | 6/2007 | Yamada | |
| 7,278,911 B2 | 10/2007 | Butterfield et al. | |
| 7,351,482 B2 | 4/2008 | Boutwell et al. | |
| 7,351,658 B2 | 4/2008 | Putkonen | |
| 7,354,663 B2 | 4/2008 | Torigoe et al. | |
| 7,384,696 B2 | 6/2008 | Hayasaki et al. | |
| 7,422,516 B2 | 9/2008 | Butterfield et al. | |
| 7,479,464 B2 | 1/2009 | Sun et al. | |
| 7,498,272 B2 | 3/2009 | Niinisto et al. | |
| 7,507,268 B2 | 3/2009 | Rosenflanz | |
| 7,510,585 B2 | 3/2009 | Rosenflanz | |
| 7,560,376 B2 | 7/2009 | Escher et al. | |
| 7,569,280 B2 | 8/2009 | Hayasaki et al. | |
| 7,672,110 B2 | 3/2010 | Sun et al. | |
| 7,696,117 B2 | 4/2010 | Sun et al. | |
| 7,780,786 B2 | 8/2010 | Mitsuhashi et al. | |
| 7,838,083 B1 | 11/2010 | Youchison et al. | |
| 7,968,205 B2 | 6/2011 | Nakano et al. | |
| 8,034,734 B2 | 10/2011 | Sun et al. | |
| 8,110,043 B2 | 2/2012 | Hass et al. | |
| 8,129,029 B2 | 3/2012 | Sun et al. | |
| 8,206,829 B2 | 6/2012 | Sun et al. | |
| 8,367,227 B2 | 2/2013 | Sun et al. | |
| 8,619,406 B2 | 12/2013 | Cho et al. | |
| 8,758,858 B2 | 6/2014 | Sun et al. | |
| 8,829,079 B2 | 9/2014 | Shultz | |
| 8,858,745 B2 | 10/2014 | Sun et al. | |
| 8,916,021 B2 | 12/2014 | Sun et al. | |
| 8,941,969 B2 | 1/2015 | Thach et al. | |
| 9,012,030 B2 | 4/2015 | Han et al. | |
| 9,034,199 B2 | 5/2015 | Duan et al. | |
| 9,090,046 B2 | 7/2015 | Sun et al. | |
| 9,142,439 B2 | 9/2015 | Jindo et al. | |
| 9,212,099 B2 | 12/2015 | Sun et al. | |
| 9,440,886 B2 | 9/2016 | Sun et al. | |
| 9,583,369 B2 | 2/2017 | Sun et al. | |
| 9,617,188 B2 | 4/2017 | Sun et al. | |
| 9,617,633 B2 | 4/2017 | He et al. | |
| 9,633,884 B2 | 4/2017 | He et al. | |
| 9,711,334 B2 | 7/2017 | Sun et al. | |
| 9,725,799 B2 * | 8/2017 | Sun | C04B 35/62222 |
| 9,790,596 B1 | 10/2017 | Kajiwara | |
| 2002/0018921 A1 | 2/2002 | Yamada et al. | |
| 2002/0043666 A1 | 4/2002 | Parsons et al. | |
| 2002/0094929 A1 | 7/2002 | Kawai et al. | |
| 2002/0100424 A1 | 8/2002 | Sun et al. | |
| 2003/0024807 A1 | 2/2003 | Baldwin et al. | |
| 2003/0029563 A1 | 2/2003 | Kaushal et al. | |
| 2003/0047464 A1 | 3/2003 | Sun et al. | |
| 2003/0051811 A1 | 3/2003 | Uchimaru et al. | |
| 2003/0110708 A1 | 6/2003 | Rosenflanz | |
| 2003/0134134 A1 | 7/2003 | Simpson et al. | |
| 2003/0164354 A1 | 9/2003 | Hsieh et al. | |
| 2003/0175142 A1 | 9/2003 | Milonopoulou et al. | |
| 2003/0200929 A1 | 10/2003 | Otsuki | |
| 2004/0013911 A1 | 1/2004 | Maeda | |
| 2004/0023811 A1 * | 2/2004 | Iijima | H10N 60/0632 505/100 |
| 2004/0157473 A1 | 8/2004 | Hayashi et al. | |
| 2004/0191545 A1 | 9/2004 | Han et al. | |
| 2004/0229078 A1 | 11/2004 | Maeda | |
| 2005/0016684 A1 | 1/2005 | Sun et al. | |
| 2005/0037193 A1 | 2/2005 | Sun et al. | |
| 2005/0136188 A1 | 6/2005 | Chang | |
| 2005/0164513 A1 | 7/2005 | DeOrnellas et al. | |
| 2005/0181566 A1 | 8/2005 | Machida et al. | |
| 2005/0227118 A1 | 10/2005 | Uchimaru et al. | |
| 2005/0284770 A1 | 12/2005 | Butterfield et al. | |
| 2006/0037536 A1 | 2/2006 | Kobayashi et al. | |
| 2006/0051602 A1 | 3/2006 | Iacovangelo et al. | |
| 2006/0066247 A1 | 3/2006 | Koshiishi et al. | |
| 2006/0073354 A1 | 4/2006 | Watanabe et al. | |

(56) References Cited

U.S. PATENT DOCUMENTS

| | | |
|---|---|---|
| 2006/0081939 A1 | 4/2006 | Akasaka et al. |
| 2006/0090704 A1 | 5/2006 | Ide et al. |
| 2006/0096704 A1 | 5/2006 | Kim |
| 2006/0110609 A1 | 5/2006 | Eaton et al. |
| 2006/0130758 A1 | 6/2006 | Lohokare et al. |
| 2006/0141139 A1 | 6/2006 | Emiliana et al. |
| 2006/0172544 A1 | 8/2006 | Inaki et al. |
| 2007/0047170 A1 | 3/2007 | Sun et al. |
| 2007/0111030 A1 | 5/2007 | Nakano et al. |
| 2008/0009417 A1 | 1/2008 | Lou et al. |
| 2008/0029032 A1 | 2/2008 | Sun et al. |
| 2008/0029211 A1 | 2/2008 | Sun et al. |
| 2008/0035898 A1 | 2/2008 | Tsuchiya et al. |
| 2008/0057326 A1 | 3/2008 | Schlichting et al. |
| 2008/0066647 A1 | 3/2008 | Harada et al. |
| 2008/0099148 A1 | 5/2008 | Ryabova et al. |
| 2008/0108225 A1 | 5/2008 | Sun et al. |
| 2008/0115725 A1 | 5/2008 | Ibe et al. |
| 2008/0142755 A1 | 6/2008 | Vaidhyanathan et al. |
| 2008/0213496 A1 | 9/2008 | Sun et al. |
| 2008/0236744 A1 | 10/2008 | Furuse et al. |
| 2008/0237029 A1 | 10/2008 | Tang et al. |
| 2008/0261800 A1 | 10/2008 | Yuan et al. |
| 2008/0264564 A1 | 10/2008 | Sun et al. |
| 2008/0264565 A1* | 10/2008 | Sun .................. C23C 16/4404 501/134 |
| 2008/0268171 A1 | 10/2008 | Ma et al. |
| 2008/0292890 A1 | 11/2008 | Hayasaki et al. |
| 2009/0036292 A1 | 2/2009 | Sun et al. |
| 2009/0142588 A1 | 6/2009 | Ohmi et al. |
| 2009/0162647 A1 | 6/2009 | Sun et al. |
| 2009/0214825 A1 | 8/2009 | Sun et al. |
| 2010/0028572 A1 | 2/2010 | Kobayashi et al. |
| 2010/0108108 A1 | 5/2010 | Hayashi et al. |
| 2010/0108261 A1 | 5/2010 | Augustino et al. |
| 2010/0119843 A1 | 5/2010 | Sun et al. |
| 2010/0119844 A1 | 5/2010 | Sun et al. |
| 2010/0129670 A1 | 5/2010 | Sun et al. |
| 2010/0151686 A1 | 6/2010 | Fang et al. |
| 2010/0160143 A1 | 6/2010 | Sun et al. |
| 2010/0175621 A1 | 7/2010 | Yamazaki et al. |
| 2010/0323124 A1 | 12/2010 | Vartabedian et al. |
| 2011/0086178 A1 | 4/2011 | Ruud et al. |
| 2011/0091700 A1 | 4/2011 | Simpson |
| 2011/0129684 A1 | 6/2011 | Okamoto et al. |
| 2011/0135915 A1 | 6/2011 | Lee et al. |
| 2011/0198034 A1 | 8/2011 | Sun et al. |
| 2011/0315081 A1 | 12/2011 | Law et al. |
| 2012/0034469 A1 | 2/2012 | Sun et al. |
| 2012/0035046 A1 | 2/2012 | Rosenflanz |
| 2012/0074514 A1 | 3/2012 | Nguyen et al. |
| 2012/0104703 A1 | 5/2012 | Sun et al. |
| 2012/0125488 A1 | 5/2012 | Sun et al. |
| 2012/0135155 A1 | 5/2012 | Han et al. |
| 2012/0144640 A1 | 6/2012 | Shih et al. |
| 2012/0154916 A1 | 6/2012 | Nishimoto et al. |
| 2012/0183790 A1 | 7/2012 | Petorak et al. |
| 2012/0196139 A1 | 8/2012 | Petorak et al. |
| 2012/0231292 A1 | 9/2012 | Chang et al. |
| 2012/0237745 A1 | 9/2012 | Dierkes et al. |
| 2012/0247667 A1 | 10/2012 | Hashiguchi et al. |
| 2012/0309204 A1 | 12/2012 | Kang et al. |
| 2013/0026693 A1 | 1/2013 | Ranish et al. |
| 2013/0048606 A1 | 2/2013 | Mao et al. |
| 2013/0071685 A1 | 3/2013 | Iwaki et al. |
| 2013/0115097 A1 | 5/2013 | Berger |
| 2013/0130052 A1 | 5/2013 | Menuey et al. |
| 2013/0156958 A1 | 6/2013 | Belov et al. |
| 2013/0168020 A1 | 7/2013 | Hashiguchi et al. |
| 2013/0174983 A1 | 7/2013 | Kikuchi et al. |
| 2013/0216783 A1 | 8/2013 | Duan et al. |
| 2013/0216821 A1 | 8/2013 | Sun et al. |
| 2013/0224457 A1 | 8/2013 | Lee |
| 2013/0224498 A1 | 8/2013 | Sun et al. |
| 2013/0273313 A1 | 10/2013 | Sun et al. |
| 2013/0273327 A1 | 10/2013 | Sun et al. |
| 2013/0284373 A1 | 10/2013 | Sun et al. |
| 2013/0288037 A1 | 10/2013 | Sun et al. |
| 2013/0333592 A1 | 12/2013 | Nakagawa et al. |
| 2014/0030486 A1 | 1/2014 | Sun et al. |
| 2014/0030533 A1 | 1/2014 | Sun et al. |
| 2014/0031533 A1 | 1/2014 | Liu et al. |
| 2014/0034242 A1 | 2/2014 | Sant et al. |
| 2014/0037969 A1 | 2/2014 | Margolies et al. |
| 2014/0116338 A1 | 5/2014 | He et al. |
| 2014/0120312 A1 | 5/2014 | He et al. |
| 2014/0154465 A1 | 6/2014 | Sun et al. |
| 2014/0159325 A1 | 6/2014 | Parkhe et al. |
| 2014/0177123 A1 | 6/2014 | Thach et al. |
| 2014/0234653 A1 | 8/2014 | Mizuno et al. |
| 2014/0349073 A1 | 11/2014 | Sun et al. |
| 2014/0363596 A1 | 12/2014 | Sun et al. |
| 2014/0377504 A1 | 12/2014 | Sun et al. |
| 2015/0004418 A1 | 1/2015 | Sun et al. |
| 2015/0021324 A1 | 1/2015 | Sun et al. |
| 2015/0024155 A1 | 1/2015 | Sun et al. |
| 2015/0061237 A1 | 3/2015 | Sun et al. |
| 2015/0064450 A1 | 3/2015 | Sun et al. |
| 2015/0075714 A1 | 3/2015 | Sun et al. |
| 2015/0079370 A1 | 3/2015 | Sun et al. |
| 2015/0133285 A1 | 5/2015 | Sun et al. |
| 2015/0152540 A1 | 6/2015 | Sato et al. |
| 2015/0158775 A1 | 6/2015 | Sun et al. |
| 2015/0218057 A1 | 8/2015 | Duan et al. |
| 2015/0270108 A1 | 9/2015 | Sun et al. |
| 2015/0275361 A1 | 10/2015 | Lubomirsky et al. |
| 2015/0275375 A1 | 10/2015 | Kim et al. |
| 2015/0299050 A1 | 10/2015 | Sun et al. |
| 2015/0307982 A1 | 10/2015 | Firouzdor et al. |
| 2015/0311043 A1 | 10/2015 | Sun et al. |
| 2015/0311044 A1 | 10/2015 | Sun et al. |
| 2015/0321964 A1 | 11/2015 | Sun et al. |
| 2015/0329430 A1 | 11/2015 | Sun et al. |
| 2015/0329955 A1 | 11/2015 | Sun et al. |
| 2016/0042924 A1 | 2/2016 | Kim et al. |
| 2016/0079040 A1 | 3/2016 | Park et al. |
| 2016/0211121 A1 | 7/2016 | Sun et al. |
| 2016/0312351 A1 | 10/2016 | Liu et al. |
| 2016/0326060 A1 | 11/2016 | Sun et al. |
| 2016/0326061 A1 | 11/2016 | Sun et al. |
| 2016/0375515 A1 | 12/2016 | Xu et al. |
| 2016/0379806 A1 | 12/2016 | Xu et al. |
| 2017/0022595 A1 | 1/2017 | Sato et al. |
| 2017/0110293 A1 | 4/2017 | Sun et al. |
| 2017/0133207 A1 | 5/2017 | Sun et al. |

FOREIGN PATENT DOCUMENTS

| | | |
|---|---|---|
| CN | 103215535 | 7/2013 |
| JP | 2000001362 | 1/2000 |
| JP | 2004010981 | 1/2004 |
| JP | 2004100039 A | 4/2004 |
| JP | 2005170728 A | 6/2005 |
| JP | 2006118053 | 5/2006 |
| JP | 2006-169422 A | 6/2006 |
| JP | 2007-138288 A | 6/2007 |
| JP | 2007-191794 A | 8/2007 |
| JP | 2007223828 | 9/2007 |
| JP | 2008273823 A | 11/2008 |
| JP | 2009068066 | 4/2009 |
| JP | 2009068067 | 4/2009 |
| JP | 2010006641 | 1/2010 |
| JP | 2010070854 | 4/2010 |
| JP | 2011054801 A | 3/2011 |
| JP | 2014062332 | 4/2014 |
| JP | 2015227512 | 12/2015 |
| JP | 2016089241 | 5/2016 |
| KR | 10-2003-0025007 | 3/2003 |
| KR | 10-2007-0013118 | 1/2007 |
| KR | 20080096340 A | 10/2008 |
| KR | 10-1108692 B1 | 1/2012 |
| KR | 20170044396 | 4/2017 |
| TW | 200842944 A | 11/2008 |
| TW | 201036086 | 10/2010 |

(56) References Cited

FOREIGN PATENT DOCUMENTS

| WO | 2002/000968 A1 | 1/2002 |
| --- | --- | --- |
| WO | 03059615 A1 | 7/2003 |
| WO | 2012/012431 | 1/2012 |
| WO | 2012/033326 A2 | 3/2012 |
| WO | 2013/126466 | 8/2013 |
| WO | 2013/155220 | 10/2013 |
| WO | 2013/162909 | 10/2013 |
| WO | 2014/018830 | 1/2014 |
| WO | 2014/018835 | 1/2014 |
| WO | 2014/190211 | 11/2014 |
| WO | 2014/197203 | 12/2014 |
| WO | 2014/205212 | 12/2014 |
| WO | 2015/009745 | 1/2015 |
| WO | 2015/013070 | 1/2015 |
| WO | 2015/042196 | 3/2015 |
| WO | 2015/073458 | 5/2015 |
| WO | 2015/153123 A1 | 10/2015 |
| WO | 2015164263 A1 | 10/2015 |
| WO | 2015164638 A1 | 10/2015 |
| WO | 2015171801 A1 | 11/2015 |
| WO | 2015175987 A1 | 11/2015 |

OTHER PUBLICATIONS

Kitamura et al., "Structural, Mechanical and Erosion Properties of Yttrium Oxide Coatings by Axial Suspension Plasma Spraying for Electronics Applications," Journal of Thermal Spray Technology, 20:170-185, Jan. 2011.

Refke, et al "LPPS thin film technology for the application of TBC systems", International Thermal Spray Conference, Basel Switzerland, May 2-4, 2005, 6 pages.

Lewis, Richard J.Sr., editor; Hawley's Condensed Chemical Dictionary, 12th edition, 1993, pp. 540 & 990, Van Nostrand Reinhold company, New York.

Machine translation of KR10-1108692 B1 by Park et al., issued Jan. 25, 2012.

Greenwood, N.N. et al., "Chemistry of the Elements" (2nd Edition), 1998, p. 1295: Appendix 5: Effective Ionic Radii in pm for Various Oxidation States; School of Chemistry, University of Leeds, U.K.; online version available at app.knovel.com/hotlink/pdf/id:kt003BKDL1/chemistry-elements-2nd/effective-ionic-radii.

Wachtman, J.B. et al., ed. "Ceramic Films and Coatings", Ch. 6, "Optical Thin Films", copyright 1993, Noyes Publications, pp. 189-223. Online version available at: app.knovel.com/hotlink/pdf/ld:kt00194M71/ceramic-films-coatings/optical-thin-films.

Bhatia T., et al., "Mechanisms of Ceramic Coating Deposition in Solution-Precursor Plasma Spray," Journal of Materials Chemistry and Research, Materials Research Society, Warrendale, PA, USA, Sep. 2002, vol. 17, No. 9, 10 Pages.

Curtis C.E., "Properties of Yttrium Oxide Ceramics," Journal of the American Ceramic Society, Presented at the Fifty-Eighth Annual Meeting, The American Ceramic Society, New York, N.Y, Apr. 23, 1956, 1 Page, (Abstract Only).

International Preliminary Report on Patentability for International Application No. PCT/US2014/046732, mailed Feb. 4, 2016, 11 Pages.

International Preliminary Report on Patentability for International Application No. PCT/US2014/046734, mailed Jan. 28, 2016, 8 Pages.

International Search Report and Written Opinion for International Application No. PCT/US2014/046732, mailed Nov. 27, 2014, 14 Pages.

International Search Report and Written Opinion for International Application No. PCT/US2014/046734, mailed Nov. 5, 2014, 9 Pages.

Takimoto K., et al., "Linear thermal Expansion Coefficients of Amorphous and Microcrystalline Silicon Films," Journal of Non-Crystalline Solids, Apr. 2002, vol. 299, pp. 314-317, 1 Page. (Abstract Only).

* cited by examiner

ION BEAM SPUTTERING WITH ION ASSISTED DEPOSITION FOR COATINGS ON CHAMBER COMPONENTS

RELATED APPLICATIONS

This patent application is a divisional of U.S. application Ser. No. 15/844,251, filed Dec. 15, 2017, which is a continuation of U.S. application Ser. No. 15/711,885, filed Sep. 21, 2017, which is a divisional application of U.S. application Ser. No. 15/211,993, filed Jul. 15 2016, which is a continuation of U.S. application Ser. No. 14/562,399, filed Dec. 5, 2014, which claims the benefit under 35 U.S.C. § 119 (e) of U.S. Provisional Application No. 61/912,961, filed Dec. 6, 2013, all of which are herein incorporated by reference. This patent application is also related to U.S. application Ser. No. 15/712,094, filed Sep. 21, 2017, which is herein incorporated by reference.

TECHNICAL FIELD

Embodiments of the present invention relate, in general, to chamber components having a thin film plasma resistant protective layer.

BACKGROUND

In the semiconductor industry, devices are fabricated by a number of manufacturing processes producing structures of an ever-decreasing size. Some manufacturing processes, such as plasma etch and plasma clean processes, expose a substrate to a high-speed stream of plasma to etch or clean the substrate. The plasma may be highly corrosive, and may corrode processing chambers and other surfaces that are exposed to the plasma. This corrosion may generate particles, which frequently contaminate the substrate that is being processed, contributing to device defects.

As device geometries shrink, susceptibility to defects increases, and particle contaminant requirements (i.e., on-wafer performance) become more stringent. To minimize particle contamination introduced by plasma etch and/or plasma clean processes, chamber materials have been developed that are resistant to plasmas. Examples of such plasma resistant materials include ceramics composed of $Al_2O_3$, AlN, SiC, $Y_2O_3$, quartz, and ZrO2. Different ceramics provide different material properties, such as plasma resistance, rigidity, flexural strength, thermal shock resistance, and so on. Also, difference ceramics have different material costs. Accordingly, some ceramics have superior plasma resistance, other ceramics have lower costs, and still other ceramics have superior flexural strength and/or thermal shock resistance.

SUMMARY

In one example implementation, an article comprises a body and a conformal protective layer on at least one surface of the body. The conformal protective layer is a plasma resistant rare earth oxide film having a thickness of less than 1000 μm, wherein the plasma resistant rare earth oxide is selected from a group consisting of $YF_3$, $Er_4Al_2O_9$, $ErAlO_3$, and a ceramic compound comprising $Y_4Al_2O_9$ and a solid-solution of $Y_2O_3$—$ZrO_2$.

In another example implementation, an article comprises a body and a conformal protective layer on at least one surface of the body. The conformal protective layer is a plasma resistant rare earth oxide film having a thickness of less than 1000 μm, wherein the plasma resistant rare earth oxide has a composition of 40-45 mol % of $Y_2O_3$, 5-10 mol % of $ZrO_2$, 35-40 mol % of $Er_2O_3$, 5-10 mol % of $Gd_2O_3$, and 5-15 mol % of $SiO_2$.

In another example implementation, an article comprises a body and a conformal protective layer on at least one surface of the body. The conformal protective layer is a plasma resistant rare earth oxide film having a thickness of less than 1000 μm, wherein the plasma resistant rare earth oxide has a composition selected from a group consisting of: an Er—Y composition, an Er—Al—Y composition, an Er—Y—Zr composition, and an Er—Al composition.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
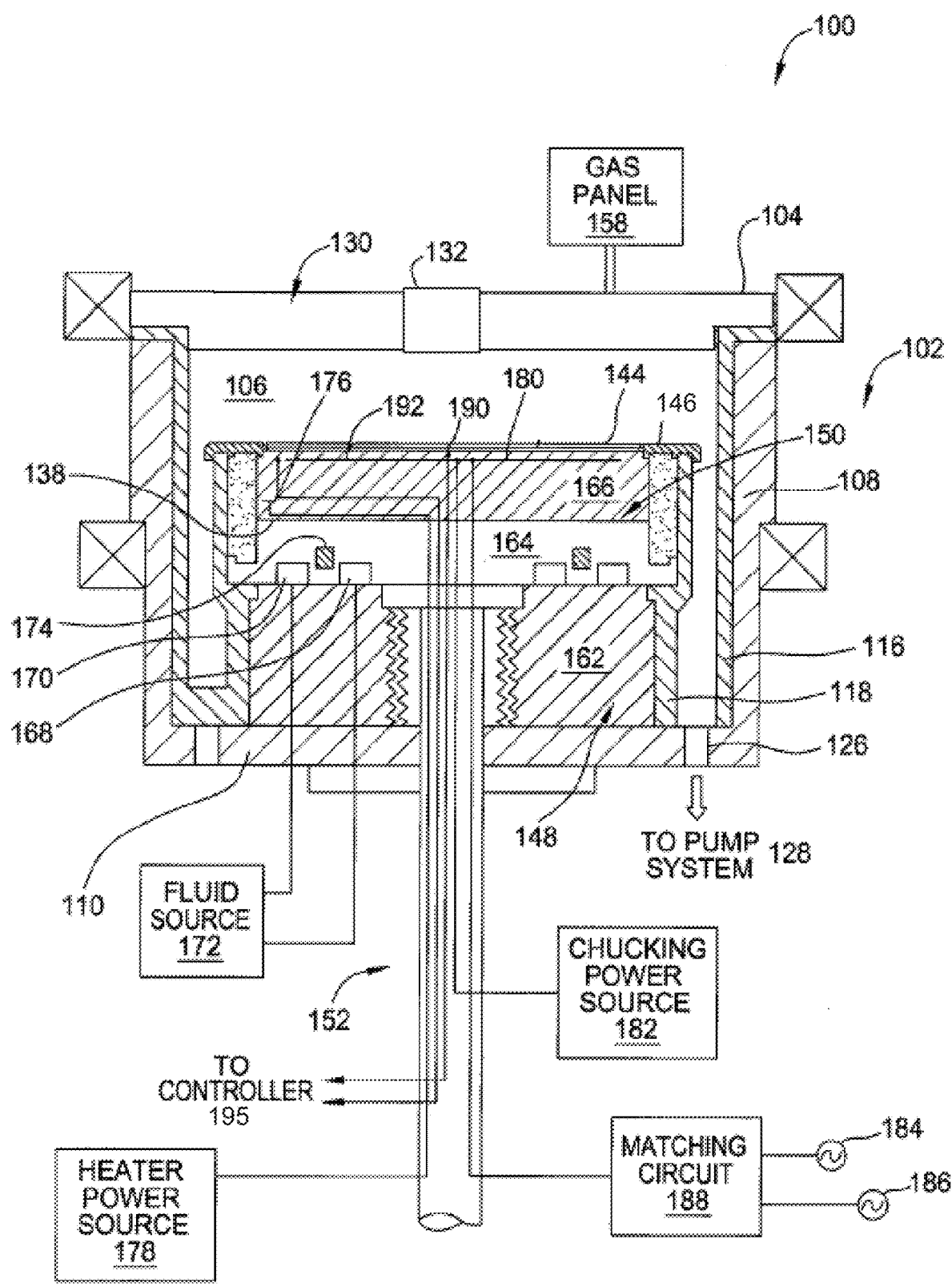
FIG. 1 depicts a sectional view of one embodiment of a processing chamber.

Embodiments of the present invention provide an article such as a process kit ring, dielectric showerhead, electrostatic chuck (ESC), view port, lid and/or nozzle or liners for an etch reactor having a thin film protective layer on one or more plasma facing surfaces of the article. The protective layer may have a thickness up to approximately 1000 μm, and may provide plasma corrosion resistance for protection of the article. The protective layer may be formed on the article using ion beam sputtering with ion assisted deposition (IBS-IAD). The thin film protective layer may be $Y_3Al_5O_{12}$, $Y_4Al_2O_9$, $Er_2O_3$, $Gd_2O_3$, $Er_3Al_5O_{12}$, $Gd_3Al_5O_{12}$, a ceramic compound comprising $Y_4Al_2O_9$ and a solid-solution of $Y_2O_3$—$ZrO_2$, or another rare-earth oxide. The improved erosion resistance provided by the thin film protective layer may improve the service life of the article, while reducing maintenance and manufacturing cost. Additionally, the IBS-IAD coating can be applied thick enough to provide a longer life time for the article, and may have good hermetic sealing to maintain a vacuum. IBS-IAD coatings can be applied and later refurbished at low cost.

The thin film protective layer on the article may be highly resistant to plasma etching, and the article may have superior mechanical properties such as a high flexural strength and/or a high thermal shock resistance. Performance properties of the thin film protective layer on article may include a relatively high thermal capability (e.g., ability to withstand operating temperatures of up to approximately 150° C.), a relatively long lifespan (e.g., over approximately 2 years when used in a plasma environment), low on-wafer particle and metal contamination, and a stable electrostatic chuck (ESC) leakage current performance (e.g., when the article is an ESC).

For example, conductor lids are components used in semiconductor manufacturing for high temperature applications where forming the lids of $Al_2O_3$ provides high thermal conductivity and flexural strength. However, under Fluorine chemistry exposed $Al_2O_3$ forms AlF particles as well as Al metal contamination on-wafer. A thin film protective layer according to one embodiment on the plasma facing side of the lid can significantly reduce erosion and reduce Al metal contamination.

In another example, dielectric showerheads for use in semiconductor manufacturing chambers can be formed of an anodized Al base bonded to a SiC faceplate. The SiC faceplate could have a high erosion rate affecting wafer etch uniformity. Further, the bonding of the faceplate to the anodized Al base could be damaged due to plasma exposure, such that the faceplate is non-uniformly bonded to the anodized Al base reducing the thermal uniformity of the showerhead. A thin film protective layer according to one embodiment can be applied directly over bare Al base to improve bonding and erosion difficulties.

In another example, semiconductor manufacturing chamber liners (e.g., chamber liner kits) can be formed of an Al substrate coated with a thin film protective layer according to one embodiment on a plasma-exposed side and anodized Al on a non-plasma exposed side. As a result, the thin film protective layer can improve on-wafer performance as well as widen the cleaning window based on the coating porosity level.

In another example, process kit rings are made out of quartz (e.g., for conductor etch) and Si (e.g., for dielectric etch) and are positioned about a wafer to improve plasma density uniformity for uniform etching. However, quartz and Si can have high erosion rates under various etch chemistries and can produce on-wafer particles. A thin film protective layer according to one embodiment can reduce erosion to improve the lifetime and reduce on-wafer defects without affecting plasma uniformity.

Electrostatic chucks (ESCs) can be formed of a ceramic puck that chucks a wafer. For example, the puck can be formed of $Al_2O_3$ or AlN and be bonded to an anodized Al base. $Al_2O_3$, AlN, and anodized Al have poor erosion resistance and, within 100 RFhr of processing time, a surface of the ceramic puck can be degraded due to erosion. The degradation of the surface of the ceramic puck can negatively affects wafer chucking, increases He leak rate, and produces on-wafer and backside particles. A thin film protective layer according to one embodiment can reduce erosion to improve the lifetime of chamber components and reduce on-wafer defects.

View ports can be formed of quartz and $Al_2O_3$, which both have low erosion resistance so plasma chemistry erodes these materials quickly which skews optical signals. A thin film protective layer according to one embodiment can reduce erosion to improve the lifetime and reduce skewing of the optical signal.

FIG. 1 is a sectional view of a semiconductor processing chamber 100 having one or more chamber components that are coated with a thin film protective layer in accordance with embodiments of the present invention. The processing chamber 100 may be used for processes in which a corrosive plasma environment is provided. For example, the processing chamber 100 may be a chamber for a plasma etch reactor (also known as a plasma etcher), a plasma cleaner, and so forth. Examples of chamber components that may include a thin film protective layer include a substrate support assembly 148, an electrostatic chuck (ESC) 150, a ring (e.g., a process kit ring or single ring), a chamber wall, a base, a gas distribution plate, a showerhead, a liner, a liner kit, a shield, a plasma screen, a flow equalizer, a cooling base, a chamber viewport, a chamber lid 104, a nozzle, and so on. In one particular embodiment, the protective layer is applied over a chamber lid 104 and/or a chamber nozzle 132.

The thin film protective layer, which is described in greater detail below, is a rare earth oxide layer deposited by IBS-IAD. The thin film protective layer may include $Y_2O_3$ and $Y_2O_3$ based ceramics, $Y_3Al_5O_{12}$ (YAG), $Y_4Al_2O_9$ (YAM), $YAlO_3$ (YAP), $Er_2O_3$ and $Er_2O_3$ based ceramics, $Gd_2O_3$ and $Gd_2O_3$ based ceramics, $Er_3Al_5O_{12}$ (EAG), $Gd_3Al_5O_{12}$ (GAG), $Nd_2O_3$ and $Nd_2O_3$ based ceramics, $Er_4Al_2O_9$ (EAM), $ErAlO_3$ (EAP), $Gd_4Al_2O_9$ (GdAM), $GdAlO_3$ (GdAP), $Nd_3Al_5O_{12}$ (NdAG), $Nd_4Al_2O_9$ (NdAM), $NdAlO_3$ (NdAP), and/or a ceramic compound comprising $Y_4Al_2O_9$ and a solid-solution of $Y_2O_3$—$ZrO_2$. The thin film protective layer may also include $YF_3$, Er—Y compositions (e.g., Er 80 wt % and Y 20 wt %), Er—Al—Y compositions (e.g., Er 70 wt %, Al 10 wt %, and Y 20 wt %), Er—Y—Zr compositions (e.g., Er 70 wt %, Y 20 wt % and Zr-10 wt %), or Er—Al compositions (e.g., Er 80 wt % and Al 20 wt %).

The thin film protective layer may also be based on a solid solution formed by any of the aforementioned ceramics. With reference to the ceramic compound comprising $Y_4Al_2O_9$ and a solid-solution of $Y_2O_3$—$ZrO_2$, in one embodiment the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0-60 mol % and $Al_2O_3$ in a range of 0-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 70-90 mol %, $ZrO_2$ in a range of 0-20 mol % and $Al_2O_3$ in a range of 10-20 mol %. In another embodiment, the ceramic compound can include $Y_2O_3$ in a range of 60-80 mol %, $ZrO_2$ in a range of 0-10 mol % and $Al_2O_3$ in a range of 20-40 mol %. In another embodiment, the ceramic compound can include $Y_2O_3$ in a range of 40-60 mol %, $ZrO_2$ in a range of 0-20 mol % and $Al_2O_3$ in a range of 30-40 mol %. In other embodiments, other distributions may also be used for the ceramic compound.

In one embodiment, an alternative ceramic compound that includes a combination of $Y_2O_3$, $ZrO_2$, $Er_2O_3$, $Gd_2O_3$ and $SiO_2$ is used for the protective layer. In one embodiment, the alternative ceramic compound can include $Y_2O_3$ in a range of 40-45 mol %, $ZrO_2$ in a range of 0-10 mol %, Er2O3 in a range of 35-40 mol %, Gd2O3 in a range of 5-10 mol % and SiO2 in a range of 5-15 mol %. In a first example, the alternative ceramic compound includes 40 mol % $Y_2O_3$, 5 mol % $ZrO_2$, 35 mol % $Er_2O_3$, 5 mol % $Gd_2O_3$ and 15 mol % $SiO_2$. In a second example, the alternative ceramic compound includes 45 mol % $Y_2O_3$, 5 mol % $ZrO_2$, 35 mol % $Er_2O_3$, 10 mol % $Gd_2O_3$ and 5 mol % $SiO_2$. In a third example, the alternative ceramic compound includes 40 mol % $Y_2O_3$, 5 mol % $ZrO_2$, 40 mol % $Er_2O_3$, 7 mol % $Gd_2O_3$ and 8 mol % $SiO_2$.

Any of the aforementioned thin film protective layers may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

The thin film protective layer may be an IBS-IAD coating applied over different ceramics including oxide based ceramics, Nitride based ceramics and Carbide based ceramics. Examples of oxide based ceramics include $SiO_2$ (quartz), $Al_2O_3$, $Y_2O_3$, and so on. Examples of Carbide based ceramics include SiC, Si—SiC, and so on. Examples of Nitride based ceramics include AlN, SiN, and so on. IBS-IAD coating target material can be calcined powders, preformed lumps (e.g., formed by green body pressing, hot pressing, and so on), a sintered body (e.g., having 50-100% density), or a machined body (e.g., can be ceramic, metal, or a metal alloy).

In one embodiment, the processing chamber 100 includes a chamber body 102 and a lid 130 that enclose an interior volume 106. The lid 130 may have a hole in its center, and a nozzle 132 may be inserted into the hole. The chamber body 102 may be fabricated from aluminum, stainless steel or other suitable material. The chamber body 102 generally includes sidewalls 108 and a bottom 110. Any of the lid 130, nozzle 132, sidewalls 108 and/or bottom 110 may include a thin film protective layer.

An outer liner 116 may be disposed adjacent the sidewalls 108 to protect the chamber body 102. The outer liner 116 may be fabricated from and/or coated with a thin film protective layer. In one embodiment, the outer liner 116 is fabricated from aluminum oxide and includes a thin film protective layer.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 130 may be supported on the sidewall 108 of the chamber body 102. The lid 130 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the nozzle 132. The lid 130 may be a ceramic such as $Al_2O_3$, $Y_2O_3$, YAG, $SiO_2$, AlN, SiN, SiC, Si—SiC, or a ceramic compound comprising $Y_4Al_2O_9$ and a solid-solution of $Y_2O_3$—$ZrO_2$. The nozzle 132 may also be a ceramic, such as any of those ceramics mentioned for the lid. The lid 130 and/or nozzle 132 may be coated with a thin film protective layer.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). A substrate support assembly 148 is disposed in the interior volume 106 of the processing chamber 100 below the lid 130. The substrate support assembly 148 holds the substrate 144 during processing. A ring 146 (e.g., a single ring) may cover a portion of the electrostatic chuck 150, and may protect the covered portion from exposure to plasma during processing. The ring 146 may be silicon or quartz in one embodiment, and may be coated with a protective layer.

An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116. Additionally, the inner liner 118 may be coated with a thin film protective layer.

In one embodiment, the substrate support assembly 148 includes a mounting plate 162 supporting a pedestal 152, and an electrostatic chuck 150. The electrostatic chuck 150 further includes a thermally conductive base 164 and an electrostatic puck 166 bonded to the thermally conductive base by a bond 138, which may be a silicone bond in one embodiment. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the support assembly 148. The conduits 168, 170 may be fluidly coupled to a fluid source 172 that circulates a temperature regulating fluid through the conduits 168, 170. The embedded isolators 174 may be disposed between the conduits 168, 170 in one embodiment. The embedded heating elements 176 are regulated by a heater power source 178. The conduits 168, 170 and embedded heating elements 176 may be utilized to control the temperature of the thermally conductive base 164, thereby heating and/or cooling the electrostatic puck 166 and a substrate (e.g., a wafer) 144 being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features that may be formed in an upper surface of the electrostatic puck 166. The gas passages may be fluidly coupled to a source of a heat transfer (or backside) gas such as He via holes drilled in the electrostatic puck 166. In operation, the backside gas may be provided at controlled pressure into the gas passages to enhance the heat transfer between the electrostatic puck 166 and the substrate 144.

The electrostatic puck 166 includes at least one clamping electrode 180 controlled by a chucking power source 182. The at least one clamping electrode 180 (or other electrode disposed in the electrostatic puck 166 or thermally conductive base 164) may further be coupled to one or more RF power sources 184, 186 through a matching circuit 188 for maintaining a plasma formed from process and/or other gases within the processing chamber 100. The one or more RF power sources 184, 186 are generally capable of producing RF signal having a frequency from about 50 kHz to about 3 GHz and a power of up to about 10,000 Watts.

Figure 2A:
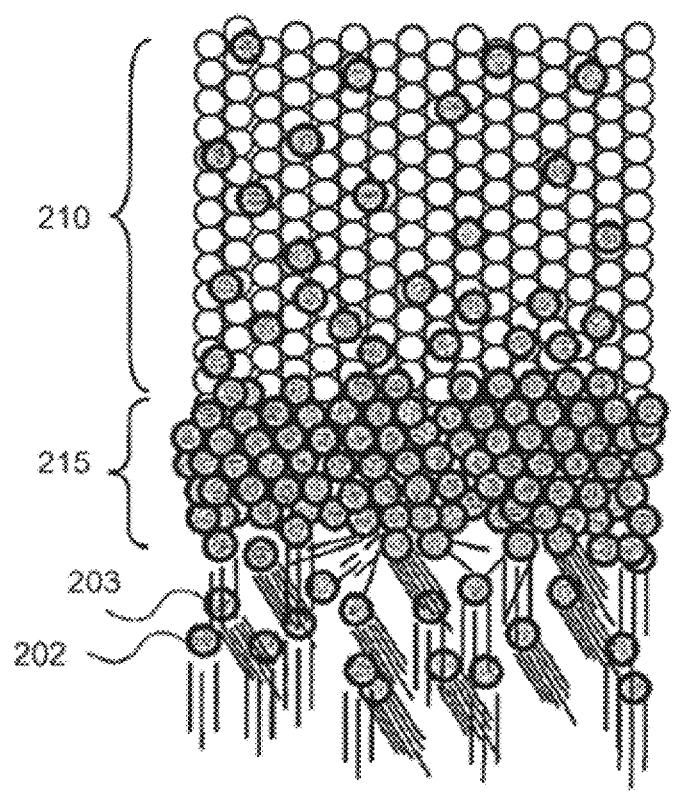
FIG. 2A depicts a deposition mechanism applicable to ion beam sputtering with ion assisted deposition (IBS-IAD).

FIG. 2A depicts a deposition mechanism applicable to IBS-IAD. IBS-IAD methods include deposition processes which incorporate sputtering in the presence of ion bombardment to form plasma resistant coatings, such as thin film protective coatings, as described herein. IBS-IAD methods may be performed in the presence of a reactive gas species, such as $O_2$, $N_2$, halogens, etc. Such reactive species may burn off surface organic contaminants prior to and/or during deposition. Additionally, the IBS-IAD deposition process can be controlled by partial pressure of $O_2$ ions in embodiments. For example, a $Y_2O_3$ coating can be made by evaporation of a Yttrium metal and bleeding of oxygen ions to form oxides the Yttrium material on the surface of the component. Alternatively, a ceramic target can be used with no oxygen or reduced oxygen.

As shown, the thin film protective layer 215 is formed on an article 210 by an accumulation of deposition materials 202 in the presence of energetic particles 203 such as ions. The deposition materials 202 may include atoms, ions, radicals, and so on. The energetic particles 203 may impinge and compact the thin film protective layer 215 as it is formed, for example, to a thickness of less than about 1000 microns. In one example, the thickness of the thin film protective layer 215 is in a range from about 0.5 microns to about 20 microns.

Figure 2B:
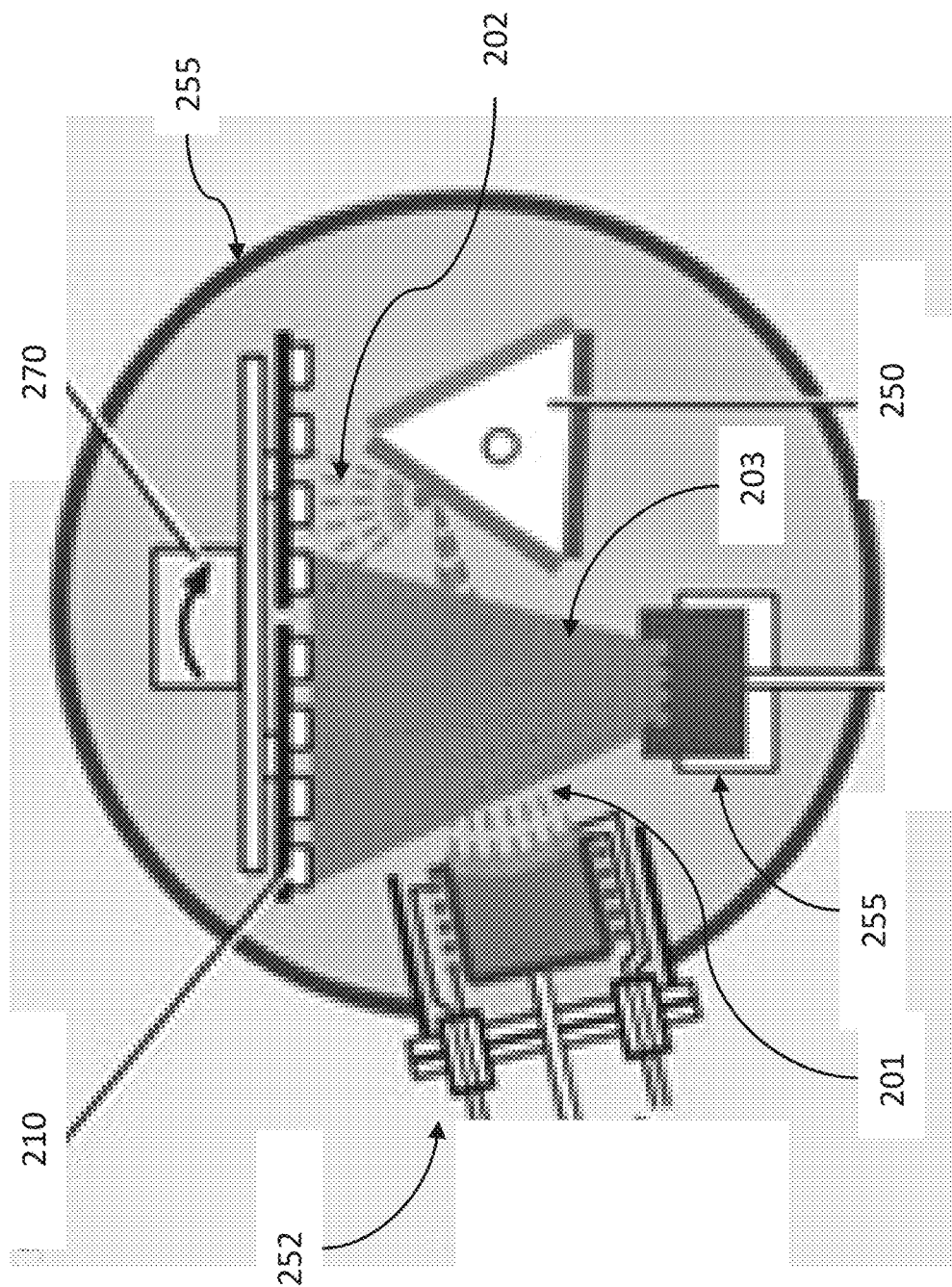
FIG. 2B depicts a schematic of an IBS-IAD apparatus.

FIG. 2B depicts a schematic of an IBS-IAD deposition apparatus. As shown, a sputtering ion source 252 provides sputtering ions 201 that are accelerated towards a material source 250 such that the impact of the sputtering ions 201 on the material source 250 ejects deposition material 202 from the material source 250 that are directed toward and impact on the article 210 to form the thin film protective layer. The deposition material 202 may be, for example, a stream of atoms. For example, the sputtering ions 201 can be a gas, such as Argon. The material source 250 can be formed of the material that forms the thin film or components of the thin film, as described herein. In an embodiment, a device (e.g., a planetary or rotating device) can move or rotate the article 210 such that the thin film is uniform and evenly distributed over desired areas of the article. In an embodiment, charge build-up on the target 250 can be avoided with the use of RF sputtering where the polarity of the sputtering ion source 252 is varied at a high rate.

Further, an energetic particle source 255 provides a flux of the energetic particles 203. Both the stream of atoms 202 and the flux of energetic particles impinge upon the article 210 throughout the IBS-IAD process. The energetic particle source 255 may be an Oxygen or other ion source. The energetic particle source 255 may also provide other types of energetic particles such as inert radicals, neutron atoms, and nano-sized particles which come from particle generation sources (e.g., from plasma, reactive gases or from the material source that provide the deposition materials).

The material source (e.g., a target body) 250 used to provide the deposition materials 202 may be a bulk sintered ceramic corresponding to the same ceramic that the thin film protective layer 215 is to be composed of. For example, the material source may be a bulk sintered ceramic compound body as described above, or bulk sintered YAG, $Er_2O_3$, $Gd_2O_3$, $Er_3Al_5O_{12}$, or $Gd_3Al_5O_{12}$, or other mentioned ceramics. For example, the target body material can be in the form of bulk material. The density of the bulk material can be from fully dense material to partially dense material (e.g., up to 80% of the theoretical maximum density). In one embodiment, target body 250 is bonded to a cooling backing plate (e.g., via a metallic bond). The cooling backing plate may prevent the target body 250 from heating above a threshold temperature during deposition. The threshold temperature may be a configuration set in accordance with a deposition recipe. In an embodiment, reactive species may also be provided during deposition of the plasma resistant coating. In one embodiment, the energetic particles 203 include at least one of non-reactive species (e.g., Ar) or reactive species (e.g., O). In further embodiments, reactive species such as CO and halogens (Cl, F, Br, etc.) may also be introduced during the formation of a plasma resistant coating to further increase the tendency to selectively remove deposited material most weakly bonded to the thin film protective layer 215.

With IBS-IAD processes, the energetic particles 203 may be controlled by the energetic ion (or other particle) source 255 independently of other deposition parameters. According to the energy (e.g., velocity), density and incident angle of the energetic ion flux, composition, structure, crystalline orientation and grain size of the thin film protective layer may be manipulated.

Additional parameters that may be adjusted for the IBS-IAD deposition process are a temperature of the article (e.g., a chamber component) during deposition as well as the duration of the deposition. In one embodiment, an IBS-IAD deposition chamber or other IBS-IAD deposition machine (and the chamber component on which the thin film protective layer is to be deposited) is heated to a starting temperature of 100° C. or less prior to deposition. The temperature of the chamber and of the chamber component may then be maintained at the starting temperature during deposition. In one embodiment, the IBS-IAD chamber includes heat lamps which perform the heating. In an alternative embodiment, the IBS-IAD chamber and the chamber component are not heated. A higher temperature during deposition may increase a density of the protective layer but may also increase a mechanical stress of the protective layer. Active cooling can be added to the IBS-IAD chamber to maintain a low temperature during coating. The low temperature may be maintained at any temperature at or below 100° C. in one embodiment. A lower temperature can result in the deposited protective layer having a more amorphous structure.

Additional parameters that may be adjusted are working distance and angle of incidence. The working distance is the distance between the material source 250 and the article 210. In one embodiment, the working distance is 0.2 to 1.0 meters. Decreasing the working distance increases a deposition rate and increases an effectiveness of the ion energy. However, decreasing the working distance below a particular point may reduce a uniformity of the protective layer. The angle of incidence is an angle at which the deposition materials 202 strike the article 210. In one embodiment the angle of incidence is 10-90 degrees, with an angle of incidence of about 30 degrees in one particular embodiment.

IBS-IAD coatings can be applied over a wide range of surface conditions with roughness from about 0.5 microinches (μin) to about 180 μin. However, smoother surface facilitates uniform coating coverage. The coating thickness can be up to about 300 microns (μm). In production, coating thickness on components can be assessed by purposely adding a rare earth oxide based colored agent such $Nd_2O_3$, $Sm_2O_3$, $Er_2O_3$, etc. at the bottom of a coating layer stack. The thickness can also be accurately measured using ellipsometry.

IBS-IAD coatings can be amorphous or crystalline depending on the rare-earth oxide composite used to create the coating. For example EAG and YAG are amorphous coatings whereas $Er_2O_3$ and the ceramic compound comprising $Y_4Al_2O_9$ and a solid-solution of $Y_2O_3$—$ZrO_2$ are typically crystalline. Amorphous coatings are more conformal and reduce lattice mismatch induced epitaxial cracks whereas crystalline coatings are more erosion resistant.

A deposited coating architecture can be a bi-layer or a multi-layer structure. In a bilayer architecture, an amorphous layer can be deposited as a buffer layer to minimize epitaxial cracks. A crystalline layer may be deposited on the top of the amorphous layer. The crystalline layer may be erosion resistant. In a multi-layer design, layer materials may be used to cause a smooth thermal gradient (a gradient of coefficients of thermal expansion) from the substrate to the top layer.

Co-deposition of multiple targets using multiple ion sputtering sources and targets can be achieved to create thicker coatings as well as layered architectures. For example, two targets having the same material type may be used at the same time. Each target may be bombarded by a different ion sputtering source. This may increase a deposition rate and a thickness of the protective layer. In another example, two targets may be different ceramic materials. A first ion sputtering source may bombard a first target to deposit a first protective layer, and a second ion sputtering source may subsequently bombard the second target to form a second protective layer having a different material composition than the first protective layer.

Post coating heat treatment can be used to achieve improved coating properties. For example, it can be used to convert an amorphous coating to a crystalline coating with higher erosion resistance. Another example is to improve the coating to substrate bonding strength by formation of a reaction zone or transition layer.

In one embodiment, components are processed in parallel in an IBS-IAD chamber. For example, up to five components may be processed in parallel in one embodiment. Each component may be supported by a different fixture. Alternatively, a single fixture may be configured to hold multiple components. The fixtures may move the supported components during deposition.

In one embodiment, a fixture to hold an article (e.g., a chamber component) can be designed out of metal components such as cold rolled steel or ceramics such as $Al_2O_3$, $Y_2O_3$, etc. The fixture may be used to support the article above, below, or in front of the material source and ion sputtering source. The fixture can have a chucking ability to chuck the component for safer and easier handling as well as during coating. Also, the fixture can have a feature to orient or align the article. In one embodiment, the fixture can be repositioned and/or rotated about one or more axes to change an orientation of the supported article to the source material. The fixture may also be repositioned to change a working distance and/or angle of incidence before and/or during deposition. The fixture can have cooling or heating channels to control the article temperature during coating. The ability to reposition and rotate the article may enable maximum coating coverage of three-dimensional surfaces such as holes since IBS-IAD is typically a line of sight process.

Figure 3:
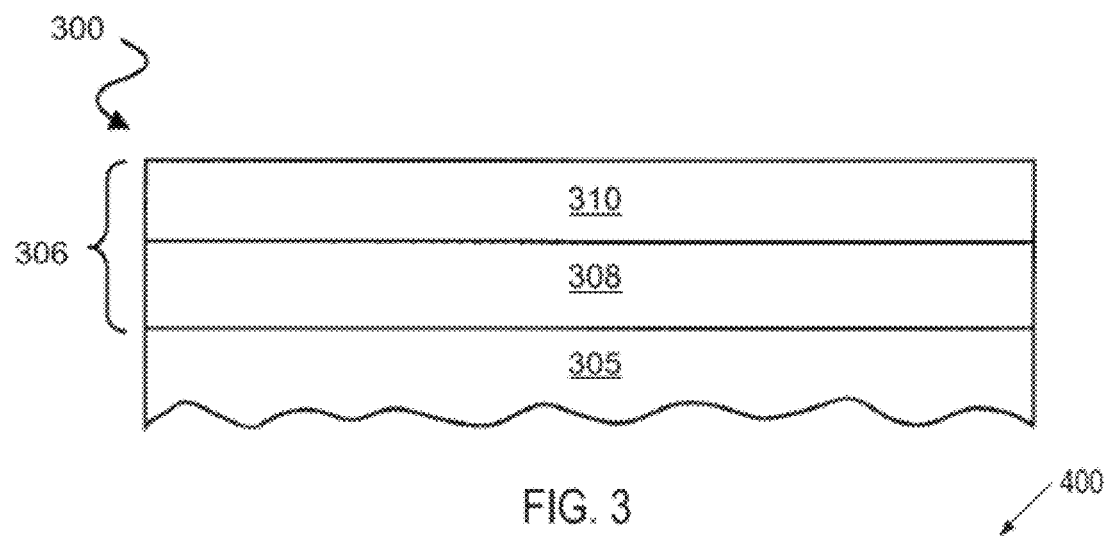
FIGS. 3-4 illustrate cross sectional side views of articles covered by one or more thin film protective layers.
Figure 4:
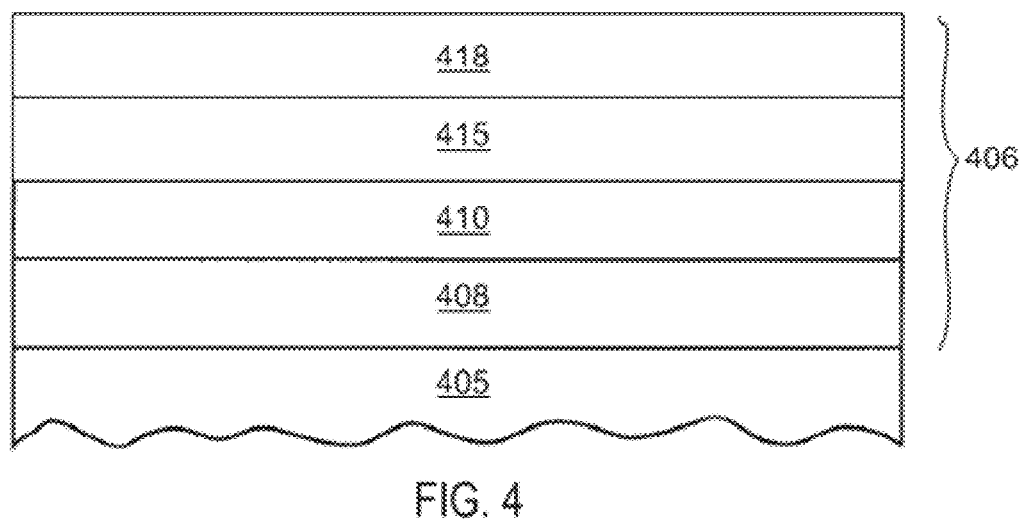

FIGS. 3-4 illustrate cross sectional side views of articles (e.g., lids, nozzles, rings, dielectric chucks, showerheads, etc.) covered by one or more thin film protective layers. Referring to FIG. 3, a body 305 of the article 300 includes a thin film stack 306 having a first thin film protective layer 308 and a second thin film protective layer 310. Alternatively, the article 300 may include only a single thin film protective layer 308 on the body 305. In one embodiment, the thin film protective layers 308, 310 have a thickness of up to about 1000 μm. In a further embodiment, the thin film protective layers have a thickness of below about 20 microns, and a thickness between about 0.5 microns to about 7 microns in one particular embodiment. A total thickness of the thin film protective layer stack in one embodiment is 1000 μm or less.

The thin film protective layers 308, 310 are deposited ceramic layers that may be formed on the body 305 of the article 300 using an IBS-IAD process. The IBS-IAD deposited thin film protective layers 308, 310 may have a relatively low film stress (e.g., as compared to a film stress caused by plasma spraying or sputtering). The relatively low film stress may cause the lower surface of the body 305 to be very flat, with a curvature of less than about 50 microns over the entire body for a body with a 12 inch diameter. The IBS-IAD deposited thin film protective layers 308, 310 may additionally have a porosity that is less than 1%, and less than about 0.1% in some embodiments. This low porosity may enable a lid having a protective layer to provide an effective vacuum seal during processing. Additionally, the IBS-IAD deposited protective layer may have a low crack density and a high adhesion to the body 305. Additionally, the IBS-IAD deposited protective layers 308, 310 may be deposited without first roughening the upper surface of the body 305 or performing other time consuming surface preparation steps.

Examples of ceramics that may be used to form the thin film protective layer 208 include $Y_3Al_5O_{12}$, $Y_4Al_2O_9$, $Er_2O_3$, $Gd_2O_3$, $Er_3Al_5O_{12}$, $Gd_3Al_5O_{12}$, a ceramic compound comprising $Y_4Al_2O_9$ and a solid-solution of $Y_2O_3$—$ZrO_2$ ($Y_2O_3$—$ZrO_2$ solid solution), or any of the other ceramic materials previously identified. Other Er based and/or Gd based plasma resistant rare earth oxides may also be used to form the thin film protective layers 308, 310. In one embodiment, the same ceramic material is not used for two adjacent thin film protective layers. However, in another embodiment adjacent layers may be composed of the same ceramic material.

Components having IBS-IAD thin film protective layers may be used in applications that apply a wide range of temperatures. For example, components with IBS-IAD thin film protective layers may be used in processes having temperatures at 0° C. to temperatures at 1000° C. The components may be used at high temperatures (e.g., at or above 300° C.) without cracking caused by thermal shock.

Note that the $Y_3Al_5O_{12}$, $Y_4Al_2O_9$, $Er_2O_3$, $Gd_2O_3$, $Er_3Al_5O_{12}$, $Gd_3Al_5O_{12}$, and the ceramic compound may be modified such that the material properties and characteristics identified above may vary by up to 30% in some embodiments. Accordingly, the described values for these material properties should be understood as example achievable values. The ceramic thin film protective layers described herein should not be interpreted as being limited to the provided values.

FIG. 4 illustrates a cross sectional side view of another embodiment of an article 400 having a thin film protective layer stack 406 deposited over a body 405 of the article 400. Article 400 is similar to article 400, except that thin film protective layer stack 406 has four thin film protective layers 408, 410, 415, 418.

The thin film protective layer stacks (such as those illustrated) may have any number of thin film protective layers. The thin film protective layers in a stack may all have the same thickness, or they may have varying thicknesses. Each of the thin film protective layers may have a thickness of less than approximately 20 microns in some embodiments. In one example, a first layer 408 may have a thickness of 10 microns, and a second layer 410 may have a thickness of 10 microns. In another example, first layer 408 may be a YAG layer having a thickness of 5 microns, second layer 410 may be a compound ceramic layer having a thickness of 5 microns, third layer 415 may be a YAG layer having a thickness of 5 microns, and fourth layer 418 may be a compound ceramic layer having a thickness of 5 microns.

The selection of the number of ceramic layers and the composition of the ceramic layers to use may be based on a desired application and/or a type of article being coated. EAG and YAG thin film protective layers formed by IBS-IAD typically have an amorphous structure. In contrast, the IBS-IAD deposited compound ceramic and $Er_2O_3$ layers typically have a crystalline or nano-crystalline structure. Crystalline and nano-crystalline ceramic layers may generally be more erosion resistant than amorphous ceramic layers. However, in some instances thin film ceramic layers having a crystalline structure or nano-crystalline structure may experience occasional vertical cracks (cracks that run approximately in the direction of the film thickness and approximately perpendicular to the coated surface). Such vertical cracks may be caused by lattice mismatch and may be points of attack for plasma chemistries. Each time the article is heated and cooled, the mismatch in coefficients of thermal expansion between the thin film protective layer and the substrate that it coats can cause stress on the thin film protective layer. Such stress may be concentrated at the vertical cracks. This may cause the thin film protective layer to eventually peel away from the substrate that it coats. In contrast, if there are not vertical cracks, then the stress is approximately evenly distributed across the thin film. Accordingly, in one embodiment a first layer 408 in the thin film protective layer stack 406 is an amorphous ceramic such as YAG or EAG, and the second layer 410 in the thin film protective layer stack 406 is a crystalline or nano-crystalline ceramic such as the ceramic compound or $Er_2O_3$. In such an embodiment, the second layer 410 may provide greater plasma resistance as compared to the first layer 408. By forming the second layer 410 over the first layer 408 rather than directly over the body 405, the first layer 408 acts as a buffer to minimize lattice mismatch on the subsequent layer. Thus, a lifetime of the second layer 410 may be increased.

In another example, each of the body, $Y_3Al_5O_{12}$ (YAG), $Y_4Al_2O_9$, $Er_2O_3$, $Gd_2O_3$, $Er_3Al_5O_{12}$, $Gd_3Al_5O_{12}$, the ceramic compound comprising $Y_4Al_2O_9$ and a solid-solution of $Y_2O_3$—$ZrO_2$, and other ceramics may have a different coefficient of thermal expansion. The greater the mismatch in the coefficient of thermal expansion between two adjacent materials, the greater the likelihood that one of those materials will eventually crack, peel away, or otherwise lose its bond to the other material. The protective layer stacks 306, 406 may be formed in such a way to minimize mismatch of the coefficient of thermal expansion between adjacent layers (or between a layer and a body 305, 405). For example, body 405 may be alumina, and EAG may have a coefficient of thermal expansion that is closest to that of alumina, followed by the coefficient of thermal expansion for YAG, followed by the coefficient of thermal expansion for the compound ceramic. Accordingly, first layer 408 may be EAG, second layer 410 may be YAG, and third layer 415 may be the compound ceramic in one embodiment.

In another example, the layers in the protective layer stack 406 may be alternating layers of two different ceramics. For example, first layer 408 and third layer 415 may be YAG, and second layer 410 and fourth layer 418 may be the compound ceramic. Such alternating layers may provide advantages similar to those set forth above in cases where one material used in the alternating layers is amorphous and the other material used in the alternating layers is crystalline or nano-crystalline.

In some embodiments, one of more of the layers in the thin film protective layer stacks 306, 406 are transition layers formed using a heat treatment. If the body 305, 405 is a ceramic body, then a high temperature heat treatment may be performed to promote interdiffusion between a thin film protective layer and the body. Additionally, the heat treatment may be performed to promote interdiffusion between adjacent thin film protective layers or between a thick protective layer and a thin film protective layer. Notably, the transition layer may be a non-porous layer. The transition layer may act as a diffusion bond between two ceramics, and may provide improved adhesion between the adjacent ceramics. This may help prevent a protective layer from cracking, peeling off, or stripping off during plasma processing.

The thermal treatment may be a heat treatment at up to about 1400-1600 degrees C. for a duration of up to about 24 hours (e.g., 3-6 hours in one embodiment). This may create an inter-diffusion layer between a first thin film protective layer and one or more of an adjacent ceramic body or second thin film protective layer. If the ceramic body is $Al_2O_3$, and the protective layer is composed of a compound ceramic $Y_4Al_2O_9$ (YAM) and a solid solution $Y_2\text{-}xZr_xO_3$ ($Y_2O_3$—$ZrO_2$ solid solution), then a $Y_3Al_5O_{12}$ (YAG) interface layer will be formed. Similarly, a heat treatment will cause a transition layer of EAG to form between $Er_2O_3$ and $Al_2O_3$. A heat treatment will also cause a transition layer of YAG to form between $Y_2O_3$ and $Al_2O_3$. A heat treatment may also cause GAG to form between $Gd_2O_3$ and $Al_2O_3$. A heat treatment of yttria stabilized zirconia (YSZ) over $Al_2O_3$ can form a transition layer of the compound ceramic of $Y_4Al_2O_9$ (YAM) and a solid solution $Y_2\text{-}xZr_xO_3$. Other transition layers may be formed between other adjacent ceramics.

In one embodiment, a coloring agent is added during the deposition of the first protective layer 308, 408. Accordingly, when the second protective layer 310, 410 wears away, an operator may have a visual queue that it is time to refurbish or exchange the lid or nozzle.

Thin film protective layers according to an embodiment provide a conforming coating that adopts the substrates microstructure, that is dense with limited or no cracking, that is amorphous and that is hermetic. For example, an He leak for an embodiment is $4 \times 10^{-10}$.

Figure 5:
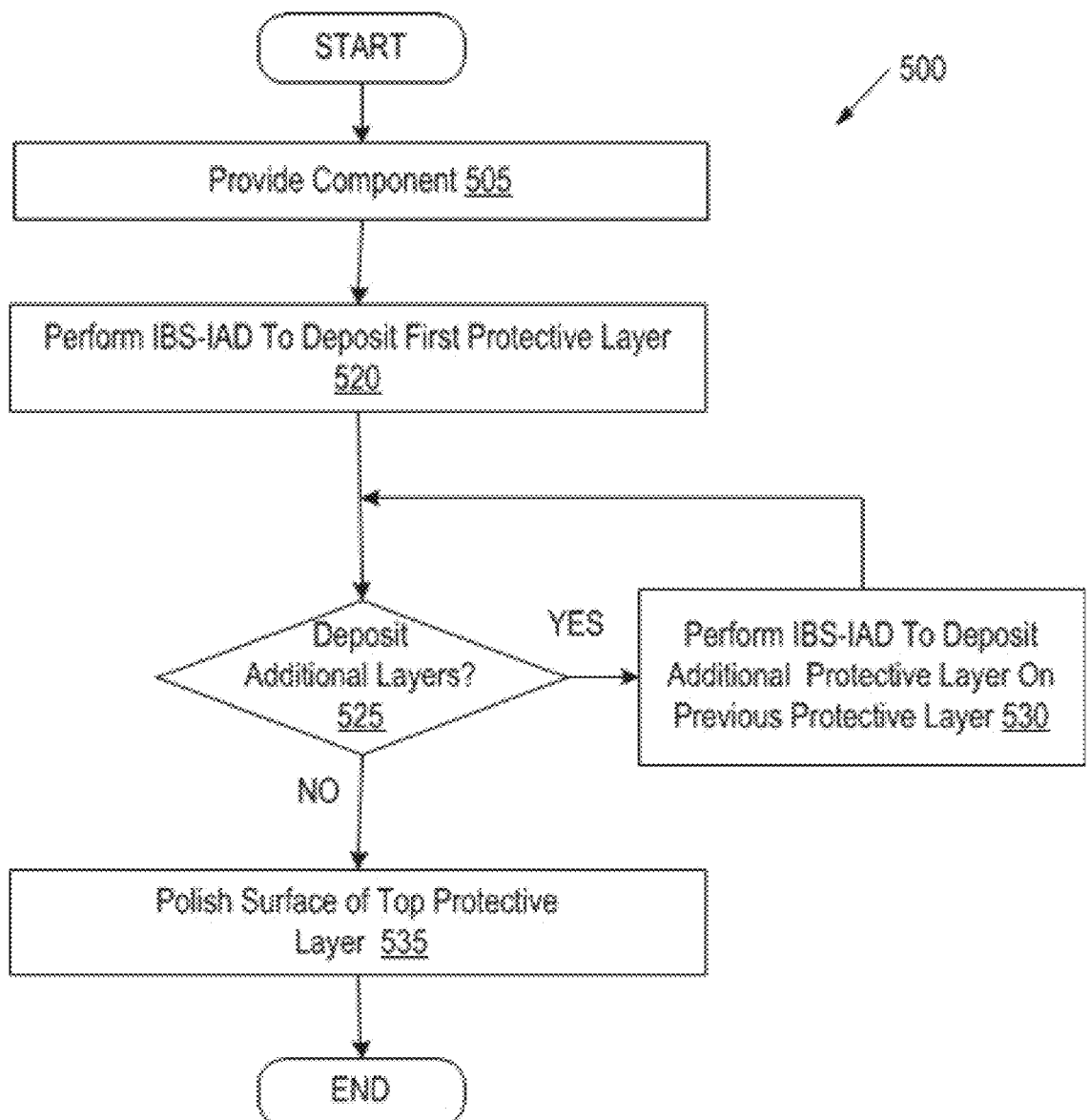
FIG. 5 illustrates one embodiment of a process for forming one or more protective layers over a chamber component.

FIG. 5 illustrates one embodiment of a process 500 for forming a thin film protective layer over a body of a chamber component. At block 505 of process 500, a component is provided. The component may have a bulk sintered ceramic body. The bulk sintered ceramic body may be $Al_2O_3$, $Y_2O_3$, $SiO_2$, or the ceramic compound comprising $Y_4Al_2O_9$ and a solid-solution of $Y_2O_3$—$ZrO_2$.

At block 520, an IBS-IAD process is performed to deposit a rare earth oxide protective layer onto at least one surface of the component. The IBS-IAD process may be performed by sputtering a material that is to be deposited and bombarding the material with ions.

The thin film protective layer may be $Y_3Al_6O_{12}$, $Y_4Al_2O_9$, $Er_2O_3$, $Gd_2O_3$, $Er_3Al_6O_{12}$, $Gd_3Al_6O_{12}$, or the ceramic compound of $Y_4Al_2O_9$ and a solid-solution of $Y_2O_3$—$ZrO_2$, or other rare earth oxides described herein. A deposition rate for the thin film protective layer may be about 0.02-20 Angstroms per second (A/s) in one embodiment, and may be varied by tuning deposition parameters. In one embodiment, a deposition rate of 0.25-1 A/s is initially used to achieve a conforming well adhering coating on the substrate. A deposition rate of 2-10 A/s may then be used for depositing a remainder of a thin film protective layer to achieve a thicker coating in a shorter time. The thin film protective layers may be very conforming, may be uniform in thickness, and may have a good adhesion to the body/substrate that they are deposited on.

In one embodiment, the material includes a coloring agent that will cause the deposited protective layer to have a particular color. Examples of coloring agents that may be used include $Nd_2O_3$, $Sm_2O_3$ and $Er_2O_3$. Other coloring agents may also be used.

At block 525, a determination is made regarding whether to deposit any additional thin film protective layers. If an additional thin film protective layer is to be deposited, the process continues to block 530. At block 530, another thin film protective layer is formed over the first thin film protective layer. The other thin film protective layer may be composed of a ceramic that is different than a ceramic of the first thin film protective layer. Alternatively, the other thin film protective layer may be composed of the same ceramic or ceramics that were used to form the first protective layer.

In one embodiment, the other thin film protective layer does not include any coloring agent. Accordingly, the subsequent protective layers may have a different color than the bottom protective layer, even if they are composed of the almost the same ceramic materials. This causes the lid or nozzle to change color when the protective layer stack is eroded down to the bottom protective layer. The change in color may signal to an operator that it is time to change the lid or nozzle of a processing chamber.

After a subsequent protective layer is deposited, the method returns to block 525. If at block 525 no additional thin film protective layers are to be applied, the process proceeds to block 535. At block 535, a surface of the protective layer is polished. The surface may be polished using chemical mechanical polishing (CMP) or other polishing procedures. In one embodiment, the surface of the top protective layer is polished to a surface roughness of below 8 micro-inches. In another embodiment, the surface of the top protective layer is polished to a surface of below 6 micro-inches.

Process 500 may be performed on a new component or on used components to refurbish the used components. In one embodiment, used components are polished before performing process 500. For example, previous protective layers may be removed by polishing before performing process 500.

With IBS-IAD processes, the energetic particles may be controlled by the energetic ion (or other particle) source independently of other deposition parameters. According to the energy (e.g., velocity), density and incident angle of the energetic ion flux, composition, structure, crystalline orientation and grain size of the thin film protective layer may be manipulated. Additional parameters that may be adjusted are a temperature of the article during deposition as well as the duration of the deposition. The ion energy may be roughly categorized into low energy ion assist and high energy ion assist. Low energy ion assist may include a voltage of about 230V and a current of about 5 A. High energy ion assist may include a voltage of about 270V and a current of about 7 A. The low and high energy for the ion assist is not limited to the values mentioned herein. The high and low level designation may additionally depend on the type of the ions used and/or the geometry of the chamber used to perform the IBS-IAD process. The ions are projected with a higher velocity with high energy ion assist than with low energy ion assist. Substrate (article) temperature during deposition may be roughly divided into low temperature (around 120-150° C. in one embodiment which is typical room temperature) and high temperature (around 270° C. in one embodiment). For high temperature IBS-IAD deposition processes, the chamber component may be heated prior to and during deposition.

TABLE 1

IBS-IAD Optimized Coating Process Parameters

| Parameter | Affects | Typical | Range |
|---|---|---|---|
| Voltage (V) | Density & Conformance | 188 | 50-500 |
| Current (A) | Density & Conformance | 7 | 2-10 |
| Temperature (° C.) | Film Stress, Crystalinity | 150 | 50-400 |
| Deposition rate (A/s) | Conformance | 1 | 0.01-20 |
| Angle of incidence (degrees) | Ability to coat 3D geometry | 30 | 0-90 |
| Working distance (in.) | Coating thickness, deposition rate | 50 | 10-300 |

Table 1 shows optimized IBS-IAD processing parameters for coating a component, in accordance with one embodiment. Table 1 additionally shows processing parameter ranges that may be used in some embodiments to deposit thin film protective layers. In other embodiments, wider ranges of some of the processing values may be used. In one embodiment, an IBS-IAD process is performed using a voltage of 150-270 Volts (V), a current of 5-7 Amps (A), a temperature of 100-270° C., a deposition rate of 0.01-20 Angstroms per second (A/s), an angle of incidence of 0-90 degrees, and a working distance of 10-300 inches (in.). In another embodiment, an IBS-IAD process is performed using a voltage of 50-500V, a current of 1-300 A, a temperature of 20-500° C., a deposition rate of 0.01-20 A/s, a working distance of 10-300 inches, and an angle of incidence of 10-90 degrees. In another embodiment, the deposition rate is about 1.5 A/sec, a start pressure is $5 \times 10^{-5}$ mbar, a temperature of about 115 to about 120 degrees C., Oxygen flow rate of 40 sccm, and Ar flow rate of 18 sccm.

The ion assist energy may be used to densify the coating and to accelerate the deposition of material on the surface of the lid or nozzle. The ion assist energy can be modified by adjusting the voltage and/or the current of the ion source. The current and voltage can be adjusted to achieve high and low coating density, to manipulate the stress of the coating, and also to affect the crystalinity of the coating. The ion assist energy can be varied from 50-500 V and from 2-20 A. The deposition rate can be varied from 0.25 to 10 A/s.

In one embodiment, a high ion assist energy used with a ceramic compound comprising $Y_4Al_2O_9$ and a solid-solution of $Y_2O_3$—$ZrO_2$ forms an amorphous protective layer and a low ion assist energy used with the ceramic compound comprising $Y_4Al_2O_9$ and a solid-solution of $Y_2O_3$—$ZrO_2$ forms a crystalline protective layer. The ion assist energy can also be used to change a stoichiometry of the protective layer. For example, a metallic target can be used, and during deposition metallic material converts to a metal oxide by the incorporation of oxygen ions at the surface of the lid or nozzle. Also, using an oxygen gun the level of any metal oxide coating can be changed and optimized to achieve desired coating properties. For example most rare earth oxides lose oxygen inside a vacuum chamber. By bleeding more oxygen inside the chamber the oxygen deficiency of the oxide coating material can be compensated.

Coating temperature can be controlled by using heaters (e.g., heat lamps) and by controlling the deposition rate. A higher deposition rate will typically cause the temperature of the lid or nozzle to increase. The deposition temperature can be varied to control a film stress, crystallinity, and so on. Temperature can be varied from 20° C. to 500° C.

The working distance can be adjusted to modify uniformity, density and deposition rate. Working distance can be varied from 10-300 inches. The deposition angle can be varied by the location of the electron beam gun or electron beam hearth, or by changing a location of the lid or nozzle in relation to the electron beam gun or electron beam hearth. By optimizing the deposition angle, a uniform coating in three dimensional geometries can be achieved. Deposition angle can be varied from 0-90 degrees, and from 10-90 degrees in one embodiment.

In one embodiment, an IBS-IAD process is performed using a voltage of about 188 V in combination with other processing parameters having any of the associated processing parameter ranges. In one embodiment, an IBS-IAD process is performed using a current of about 7 A in combination with other processing parameters having any of the associated processing parameter ranges. In one embodiment, an IBS-IAD process is performed using temperature of less than about 100° C. in combination with other processing parameters having any of the associated processing parameter ranges. In one embodiment, an IBS-IAD process is performed using a deposition rate of 1 A/s in combination with other processing parameters having any of the associated processing parameter ranges. In a further embodiment, a deposition rate of 2 A/s is used until a deposited thin film reaches a thickness of 1 μm, after which a deposition rate of 1 A/s is used. In another embodiment, a deposition rate of 0.25-1 A/s is initially used to achieve a conforming well adhering coating on the substrate. A deposition rate of 2-10 A/s may then be used for depositing a remainder of a thin film protective layer to achieve a thicker coating in a shorter time.

In one embodiment, an IBS-IAD process is performed using an angle of incidence of about 30 degrees in combination with other processing parameters having any of the associated processing parameter ranges. In one embodiment, an IBS-IAD process is performed using a working distance of about 50 inches in combination with other processing parameters having any of the associated processing parameter ranges.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±30%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
    performing ion beam sputtering with ion assisted deposition to deposit a conformal protective layer on at least one surface of a component, wherein the conformal protective layer is a plasma resistant rare earth-containing film having a thickness of less than 1000 μm, wherein a porosity of the conformal protective layer is below 1%, and wherein the plasma resistant rare earth-containing film consists essentially of 40 mol % to less than 100 mol % of $Y_2O_3$, over 0 mol % to 60 mol % of $ZrO_2$, and 0 mol % to 9 mol % of $Al_2O_3$.

2. The method of claim 1, further comprising:
    maintaining the component at a temperature in a range from about 100 degrees C. to about 400 degrees C. during the performing of the ion beam sputtering with ion assisted deposition.

3. The method of claim 1, wherein the protective layer has a thickness of 0.2-20 μm, and wherein a deposition rate of 0.25-5 Angstroms per second is used to deposit the protective layer.

4. The method of claim 1, wherein the plasma resistant rare earth-containing film consists of 40 mol % to less than 100 mol % of $Y_2O_3$ and over 0 mol % to 60 mol % of $ZrO_2$.

5. The method of claim 1, wherein the protective layer has a thickness of 0.2-20 μm.

6. The method of claim 1, wherein the porosity of the protective layer is below 0.1%.

7. The method of claim 1, further comprising:
    performing ion beam sputtering with ion assisted deposition to deposit a second protective layer on the conformal protective layer, wherein the second protective layer is an additional plasma resistant rare earth oxide film having a thickness of 0.2-30 μm, and wherein the conformal protective layer comprises a coloring agent that causes the conformal protective layer to have a different color than the second protective layer.

8. The method of claim 1, wherein the component comprises a bulk sintered ceramic body comprising at least one of $Al_2O_3$, $Y_2O_3$, $SiO_2$, SiN, Si, and SiC.

9. The method of claim 1, wherein the surface of the component has a diameter of about 12 inches, and wherein a film stress of the conformal protective layer causes a curvature of less than about 50 microns over the diameter of the surface of the component.

10. A method comprising:
    performing ion beam sputtering with ion assisted deposition to deposit a protective layer on at least one surface of a component, wherein the protective layer is a plasma resistant rare earth oxide film having a thickness of less than 1000 μm, wherein a porosity of the protective layer is below 1%, and wherein the plasma resistant rare earth oxide film is selected from a group consisting of an Er—Y oxide composition, an Er—Al—Y oxide composition, an Er—Y—Zr oxide composition, and an Er—Al oxide composition.

11. The method of claim 10, further comprising:
maintaining the component at a temperature in a range from about 100 degrees C. to about 400 degrees C. during the performing of the ion beam sputtering with ion assisted deposition.

12. The method of claim 10, wherein the protective layer has a thickness of 0.2-20 μm, and wherein a deposition rate of 0.25-5 Angstroms per second is used to deposit the protective layer.

13. The method of claim 10, wherein the plasma resistant rare earth oxide film comprises the Er—Y composition, and wherein the Er—Y oxide composition comprises 80 wt % $Er_2O_3$ and 20 wt % $Y_2O_3$.

14. The method of claim 10, wherein the plasma resistant rare earth oxide film comprises the Er—Al—Y composition, and wherein the Er—Al—Y oxide composition comprises 70 wt % $Er_2O_3$, 10 wt % $Al_2O_3$, and 20 wt % $Y_2O_3$.

15. The method of claim 10, wherein the plasma resistant rare earth oxide film comprises the Er—Y—Zr composition, and wherein the Er—Y—Zr oxide composition comprises 70 wt % $Er_2O_3$, 20 wt % $Y_2O_3$, and 10 wt % $ZrO_2$.

16. A method comprising:
performing ion beam sputtering with ion assisted deposition to deposit a protective layer on at least one surface of a component, wherein the protective layer is a plasma resistant rare earth-containing film having a thickness of less than 1000 μm, wherein a porosity of the protective layer is below 1%, and wherein the plasma resistant rare earth-containing film is selected from a group consisting of $YF_3$, $Er_4Al_2O_9$, $ErAlO_3$, and a ceramic compound comprising $Y_4Al_2O_9$ and a solid-solution of $Y_2O_3$—$ZrO_2$.

17. The method of claim 16, further comprising:
maintaining the component at a temperature in a range from about 100 degrees C. to about 400 degrees C. during the performing of the ion beam sputtering with ion assisted deposition.

18. The method of claim 16, wherein the protective layer has a thickness of 0.2-20 μm, and wherein a deposition rate of 0.25-5 Angstroms per second is used to deposit the protective layer.

19. The method of claim 16, wherein the plasma resistant rare earth-containing film comprises the ceramic compound comprising $Y_4Al_2O_9$ and the solid-solution of $Y_2O_3$—$ZrO_2$, wherein the ceramic compound has a composition of 40 mol % to less than 100 mol % of $Y_2O_3$, over 0 mol % to 60 mol % of $ZrO_2$, and 0 mol % to 9 mol % of $Al_2O_3$.

20. The method of claim 16, wherein the component comprises a bulk sintered ceramic body comprising at least one of $Al_2O_3$, $Y_2O_3$, $SiO_2$, SiN, Si, and SiC.

* * * * *